(12) United States Patent
Blanton et al.

(10) Patent No.: US 7,770,080 B2
(45) Date of Patent: Aug. 3, 2010

(54) USING NEIGHBORHOOD FUNCTIONS TO EXTRACT LOGICAL MODELS OF PHYSICAL FAILURES USING LAYOUT BASED DIAGNOSIS

(75) Inventors: Ronald DeShawn Blanton, Sewickley, PA (US); Rao H. Desineni, Poughkeepsie, NY (US); Wojciech Maly, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 630 days.

(21) Appl. No.: 11/651,782

(22) Filed: Jan. 10, 2007

(65) Prior Publication Data
US 2007/0234161 A1    Oct. 4, 2007

Related U.S. Application Data

(60) Provisional application No. 60/757,773, filed on Jan. 10, 2006.

(51) Int. Cl.
G11C 29/00    (2006.01)

(52) U.S. Cl. .............. 714/723; 714/741; 714/738; 714/737; 714/724; 714/742; 714/25; 379/14.01; 702/117; 702/118; 716/4; 716/8

(58) Field of Classification Search .............. None
See application file for complete search history.

(56) References Cited

U.S. PATENT DOCUMENTS

| | | | | |
|---|---|---|---|---|
| 5,493,504 A | * | 2/1996 | Minato | 716/2 |
| 5,898,705 A | * | 4/1999 | Graef | 714/738 |
| 6,560,736 B2 | * | 5/2003 | Ferguson et al. | 714/724 |
| 6,618,830 B1 | * | 9/2003 | Balachandran et al. | 714/737 |
| 7,392,146 B2 | * | 6/2008 | Nozuyama | 702/117 |
| 2002/0010560 A1 | * | 1/2002 | Balachandran | 702/118 |
| 2002/0178399 A1 | * | 11/2002 | Blanton | 714/25 |
| 2007/0113136 A1 | * | 5/2007 | Nakajima | 714/738 |
| 2007/0201618 A1 | * | 8/2007 | Nozuyama | 379/14.01 |

OTHER PUBLICATIONS

Waicukauski et al., "Failure Diagnosis of Structured VLSI", Aug. 1989, Carnegie Mellon Libraries, IEEE 0740-7475, pp. 49-60.*
Waicukauski, J.A., Lindbloom, E., Failure Diagnosis of Structured VLSI, IEEE Design and Test of Computers, pp. 49-60, Aug. 1989.

(Continued)

*Primary Examiner*—John P Trimmings
(74) *Attorney, Agent, or Firm*—Jones Day (57) ABSTRACT

A method and apparatus are disclosed in which defect behavior in an integrated circuit is discovered and modeled rather than assuming defect behavior in the form of a fault. A plurality of tests are performed on an integrated circuit to produce passing and failing responses. The failing responses are examined in conjunction with circuit description data to identify fault locations. For at least certain of the fault locations, the logic-level conditions at neighboring locations which describe the behavior of a failing response are identified. Those logic level conditions are combined into a macrofault for that location. The macrofault is then validated and can be then used to identify more tests for further refining the diagnosis. Because of the rules governing abstracts, this abstract should not be used to construe the claims.

23 Claims, 6 Drawing Sheets

OTHER PUBLICATIONS

Huisman, L.M., Diagnosing Arbitrary Defects in Logic Designs Using Single Location at a Time (SLAT), IEEE Transactions on Computer-Aided Design of Integrated Circuits and Systems, vol. 23, No. 1, pp. 91-101, Jan. 2004.

Aitken, Robert C., Finding Defects with Fault Models, Proc. of International Test Conference, pp. 498-505, 1995.

Lavo, David B., Chess, Brian, Larrabee, Tracy, Ferguson, F. Joel, Diagnosing Realistic Bridging Faults with Single Stuck-At Information, IEEE Transactions on Computer-Aided Design, vol. 17, No. 3, pp. 255-268, Mar. 1998.

Sato, Y., Yamazaki, I., Yamanaka, H., Ikeda, T., Takakura, M., A Persistent Diagnostic Technique for Unstable Defects, Proc. of International Test Conference, pp. 242-249, Oct. 2002.

Venkataraman, S., Drummonds, S.B., A Technique for Logic Fault Diagnosis of Interconnect Open Defects, Proc. of VLSI Test Symposium, pp. 313-318, Apr.-May 2000.

Pomeranz, Irith, Reddy, Sudhakar M., On Diagnosis of Pattern-Dependent Delay Faults, Proc. of Design Automation Conference, pp. 59-62, Jun. 2000.

Desineni, R., Vogels, T.J., Dwarakanath, K.N., Zanon, T., Blanton, R.D., Maly, W., A Multi-Stage Approach to Fault Identification Using Fault Tuples, Proc. of International Symposium for Testing and Failure Analysis, pp. 496-505, Nov. 2003.

Venkataraman, S., Drummonds, S.B., Poirot: A Logic Fault Diagnosis Tool and Its Applications, Proc. of International Test Conference, pp. 253-262, Oct. 2000.

Lavo, David B., Chess, Brian, Larrabee, Tracy, Hartanto, Ismed, Probabilistic Mixed-Model Fault Diagnosis, Proc. of International Test Conference, pp. 1084-1093, Oct. 1998.

Lavo, David B., Hartanto, Ismed, Larrabee, Tracy, Multiplets, Models, and the Search for Meaning: Improving Per-Test Fault Diagnosis, Proc. of International Test Conference, pp. 250-259, Oct. 2002.

Appello, D., Fudoli, A., Giarda, K., Tancorre, V., Understanding Yield Losses in Logic Circuits, IEEE Design and Test, vol. 21, No. 3, pp. 208-215, May-Jun. 2004.

\* cited by examiner

NEIGHBORS $(I_3) = \{I_1, I_2, I_4, I_5, I_6, I_7\}$

USING NEIGHBORHOOD FUNCTIONS TO EXTRACT LOGICAL MODELS OF PHYSICAL FAILURES USING LAYOUT BASED DIAGNOSIS

CROSS-REFERENCE TO RELATED APPLICATIONS

This case claims priority of Provisional U.S. Application Ser. No. 60/757,773 filed Jan. 10, 2006, and entitled Diagnosis of Arbitrary Defects Using Neighborhood Function Extraction, the entirety of which is hereby incorporated by reference.

BACKGROUND

The present invention is directed generally to the field of integrated circuits and, more particularly, to the field of integrated circuit testing and diagnostics.

Defects of various types occur during the manufacturing process of an integrated circuit (IC). Failure analysis (FA) is used to characterize defects that occur during fabrication of an integrated circuit (IC) so that the manufacturing process and/or design can be corrected to improve yield or test escape. However, with the increasing complexity of the IC manufacturing process, the task of FA is becoming ever more difficult. FA has been identified as one of the Grand Challenges in the near term. Software-based fault diagnosis involves using a CAD tool to identify the potential locations and types of defects in an IC by analyzing its tester response to applied stimuli at the logic level. Fault diagnosis has typically augmented the complex task of physical analysis of failure (PFA) by acting as a first step towards locating defects. However, with PFA becoming increasingly complex and time-consuming, diagnosis must take on a more important role in FA. Most defects exhibit logic-level misbehavior and, therefore, can be modeled as a logical fault.

Past approaches to fault diagnosis include techniques for fault localization and those that attempt to identify a particular type of fault, e.g., bridging faults, opens, delay faults, etc. It has been argued that localization alone is not sufficient and that using accurate fault models for diagnosis improves accuracy. The latter approach of using specific fault models for fault diagnosis works well when a defect's behavior can be conjectured fairly accurately. However, it has been shown that the commonly used fault models may be insufficient to model the complex behaviors of defects in nanoscale technologies. One approach is to use several fault models and response matching algorithms for fault diagnosis. However, those approaches require vital information regarding the logical behavior of defects for correct diagnosis.

To summarize, the primary question addressed by all the diagnosis methods described above is: "Is it there?", where "it" refers to an assumed defect behavior. A diagnosis is deemed successful if the answer to the above question is "yes." However, an important question often overlooked is: "What else can be there?" For example, a diagnosis approach that focuses on two-line shorts returns success if the behavior of a two-line short is identified from an IC's tester response. Other questions that should be asked at this stage, but are typically not addressed, include: "Is the defect really only a two-line short?" "Is the defect an N-line short, where N>2?" "Is it a multiple stuck-at fault that affected N sites, or is it an open with a behavior that mimics a short?"

SUMMARY OF THE PRESENT DISCLOSURE

We present a new method for fault diagnosis of arbitrary defects that identifies the site, defect type, and a model of the defect's behavior. Our methodology uses a very general set of assumptions regarding defect behavior that are much weaker and therefore more general than those employed by existing fault models. Our diagnosis approach is applicable to defects that exhibit logical misbehavior and is based on the following main principle: defects manifest as one or more logical faults on one or more signal lines when certain logical conditions on the physical neighbors surrounding the faulty lines are satisfied.

Our methodology first identifies the faulty signal lines and then extracts the set of logical conditions for the physical neighbors responsible for fault manifestation. Physical neighbors of the faulty site include the wires that physically surround the faulty site (as identified from the layout, for example) along with the gate inputs that drive the identified neighbors and the faulty site, and the side inputs of the gates that are driven by the faulty site. Once the conditions have been identified, the fault and the excitation conditions (called neighbor functions) for each location are represented as a "macrofault" using fault tuples, which is subsequently verified via simulation to validate that the fault accurately mimics defect behavior. If the fault fails validation, that fault is eliminated from further analysis and is deemed not to be part of any defect. The validated neighbor functions for each fault location are then combined to represent defect misbehavior in a fault derivation step. Finally, the derived faults are validated via simulation using existing and possibly additional test patterns. The validated faults are the output of our diagnosis. When defects do not meet our assumptions, it is possible that incorrect locations and/or neighbor functions are derived early in the diagnosis methodology. To account for error in the early stages, feedback from the validation stages to the location identification stage is used to backtrack and relax some of the assumptions.

It is known that industry has typically correlated fault locations identified by logic diagnosis tools with layout information. However, this correlation is largely manual and in general is restricted to identifying signal lines that are close enough to be involved in the defect. Our approach is an automated approach that uses restricted layout information to derive a precise fault model based on the logical misbehavior of a defect. Additionally, the faults derived by our methodology can be utilized for fast identification of similar defects in the future for reducing test escape and improving quality. Our methodology discovers defect behavior rather than assuming defect behavior in the form of fault models. Therefore, our methodology indirectly but explicitly addresses the question: what else is there?

In this document, we first describe the important details of our methodology and discuss our set of assumptions. We then demonstrate one application of our diagnosis methodology: we show how identification of accurate logic behavior from the test data can be utilized to reduce the number of fault locations for failure analysis. Specifically, we present results showing the reduction in the number of diagnosis candidates for several types of defects. Finally, we provide some conclusions.

BRIEF DESCRIPTION OF THE DRAWINGS

For the present invention to be easily understood and readily practiced, the invention will now be described, for purposes of illustration and not limitation, in conjunction with the following figures wherein.

DESCRIPTION OF THE PREFERRED EMBODIMENTS

Section 1

Preliminaries

In this section, we formally define the terminology used throughout this document and provide an overview of our assumptions and objectives.

An integrated circuit (IC) is defined to be any arbitrary VLSI design. The terms manufactured part and chip are used interchangeably to refer to a manufactured, silicon implementation of an IC. A chip for which diagnosis is to be performed is called the circuit-under-diagnosis (CUD.)

A defect is a permanent, unintended change in the chip structure, which could be caused, for example, by an anomaly in a manufacturing step, the presence of an unwanted particle, or a combination of both.

A fault model represents the possible logical misbehavior caused by a defect. Faults are used to abstract defect behavior to the logical level. For example, the single stuck-at fault model assumes that only one logical signal line can be permanently stuck-at either logic 0 or 1.

A test pattern is a completely-specified Boolean input vector that is applied to the primary inputs of the CUD. A test set is a set of test patterns for the CUD.

A tester response is the Boolean output vector observed at the primary outputs of the CUD after some duration (typically called the cycle time or clock period) of test period when a test pattern is applied. Similarly, a fault simulation test response is the simulation response produced by the CUD design affected by a fault. A fault is said to explain a test pattern if its fault simulation test response exactly matches the test response.

A test pattern is a failing pattern if the CUD'S tester response for the pattern differs from the defect-free CUD response; otherwise, it is called a passing pattern. For one failing pattern, any primary output for which the value in the tester response differs from the defect-free response is called a failing output. Further, a failing pattern is a SLAT pattern when at least one stuck-at fault in the circuit can explain the failing pattern; otherwise, the failing pattern is a non-SLAT pattern.

For a given signal line $l_i$ in the gate-level representation of a CUD, $l_i$'s neighborhood is defined as the set of signal lines that are a user-defined, physical distance away from $l_i$ in the layout description of the CUD and, may include, the inputs of the gate that drive $l_i$, the side inputs of gates driven by $l_i$, and the inputs of gates that drive each neighbor of $l_i$. All the signal lines in the neighborhood of $l_i$ are called neighbors.

The input to our diagnosis methodology consists of gate-level description of the CUD, neighborhood information, and a set of tester responses that also includes the applied test set for the CUD. The final output of diagnosis is one or more fault tuple macrofaults, called diagnosis candidates that describe the location and behavior of one or more defects. Identification of macrofaults that contain location and logical behavior is called logic-level characterization. Diagnosis resolution is a measure of the number of diagnosis candidates in the outcome of diagnosis.

We adopt three main assumptions regarding defects. These assumptions are used to keep the problem tractable and are briefly described here. The details concerning these assumptions and how they impact the diagnosis problem, in general, are later presented at relevant places in the document.

1. For each line $l_i$ affected by an arbitrary defect in a CUD, there exists at least one single location at a time (SLAT) pattern explained by a stuck-at fault on $l_i$. Our methodology initially uses only SLAT patterns for identifying potential defect locations. This assumption ensures that the applied test set exposes all the affected lines, thus enabling diagnosis to focus on the affected lines.

2. For a given CUD with one or more arbitrary defects, whenever a defect causes a logical error (i.e., a logic 0 flips to a logic 1 or vice-versa) on a signal line $l_i$, the neighbors (as defined above) are the only lines (if any) that cause $l_i$ to be erroneous. We use this assumption to verify $l_i$'s participation in a defect and to derive fault behavior associated with each potential defect location identified in the first stage of diagnosis. The main premise behind this assumption is the observation that defects are, in general, localized in nature, affecting a set of signal lines that reside close to each other in the IC layout.

3. For every SLAT pattern $t_i$ explained by a fault $l_i$ stuck-at-v, the logic value on every neighbor $n_i$ of the location $l_i$ is either fault-free or if it is faulty, only the fault $l_i$ stuck-at-v could have caused it (i.e., $n_i$ is on an error propagation path of $l_i/v$). This assumption is useful to make the problem of extracting behaviors for defect locations tractable, and will be explained in detail below.

Our objective is to perform logic-level defect characterization instead of just defect localization. Specifically, we want to identify a defect's location as well as the logic-level conditions that cause a defect to manifest itself as a logical fault. For example, a defect that causes a two-line short can manifest itself as a stuck-at fault on one line when the other line is driven to the opposite logic value. Being able to perform characterization instead of just localization has several advantages:

Logic-level characterization provides more insight into the source of a defect. For example, a two-line short that manifests as a dominant short where $l_1$ dominates $l_2$, has a better diagnosis outcome when $l_1$ and $l_2$ are both reported instead of just $l_2$. The information that both $l_1$ and $l_2$ are involved in a defect can potentially be used to deduce the source of a defect as being a conducting spot defect that shorts $l_1$ and $l_2$.

Characterization can lead to better localization. For instance, the area of the CUD for PFA can be reduced if diagnosis reports a bridge between two lines, instead of a set of lines, because in the former case only the area where the lines are actually adjacent has to be examined.

Characterization can potentially eliminate the huge cost associated with PFA and can be automated for collecting statistically large amounts of data. For example, if there are many failing chips (during a yield excursion), a fault diagnosis that provides fault type information can help to identify the main source of failure and, therefore, can speedup corrective action.

As mentioned, our objective is to correctly identify a defect behavior and location without using fault models explicitly. This aspect has direct and far-reaching implications, especially when a defect is unknown or when a defect behavior cannot be accurately captured using an existing fault model. Our objective is to extract the defect behavior from the test patterns, tester response, and physical neighborhood information of the affected (by the defect) signal lines. The extracted behavior, which can potentially denote an arbitrary function, is represented using fault tuples, which can subsequently be validated using fault tuples based analysis tools.

Section 2

Our Methodology

Figure 1:
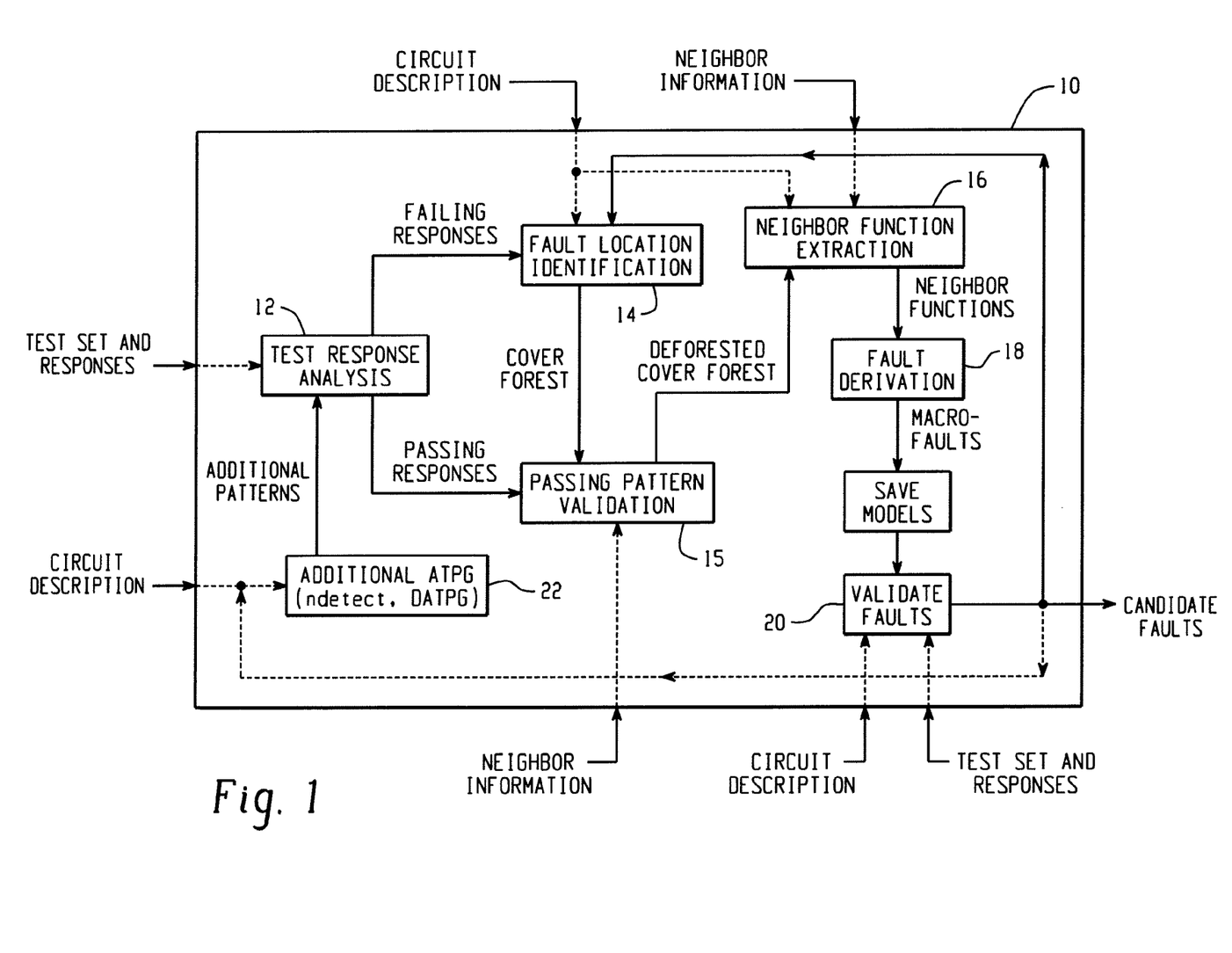
FIG. 1 illustrates the process flow of the method disclosed herein.

An overview of our diagnosis methodology is provided in FIG. 1. Our method 10 receives as an input various test sets and the responses produced by performing the test sets on the circuit-under-diagnosis (CUD). At step 12, the method 10 separates the tester responses into failing and passing responses. The failing responses are operated on at 14, using as additional input a description of the CUD, to identify potential faulty signal lines (i.e., fault locations or fault sites). Each site is fault simulated. A fault is said to explain a failing response if the fault's simulation test response exactly matches the failed response produced by the tester. Sites having a fault simulation that explains a failing response are retained. The retained sites are organized into a graph referred to as a "cover forest". The cover forest graph may be comprised of tuples of the form (fi, s, n) where fi is the representative of the equivalence class of faults in the vertex, is the number of SLAT patterns explained by each fault belonging to the vertex, and n is the number of faults in the vertex as described below in conjunction with FIG. 5.

Figure 2:
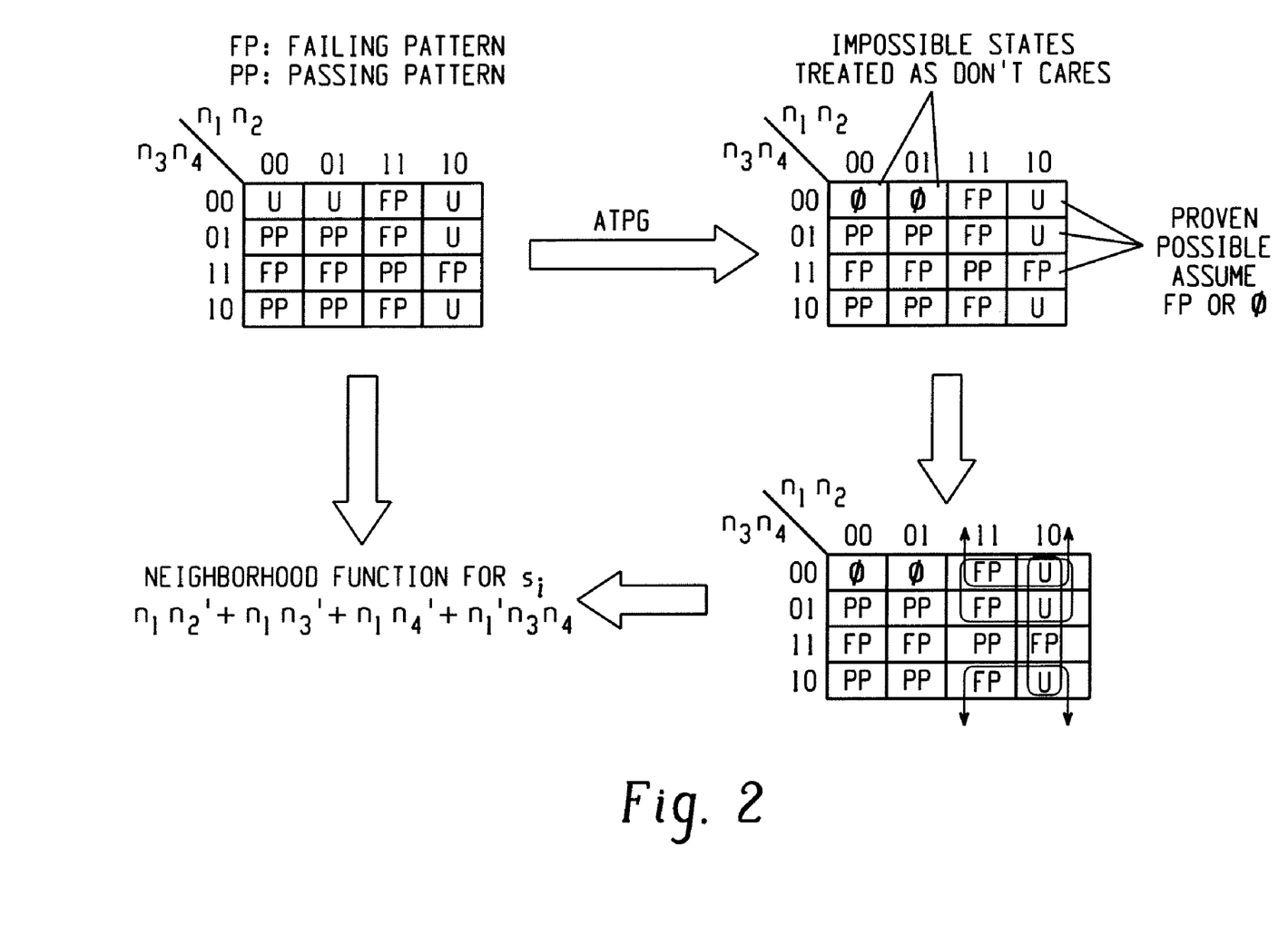
FIG. 2 graphically illustrates the process of neighborhood function extraction.
Figure 5:
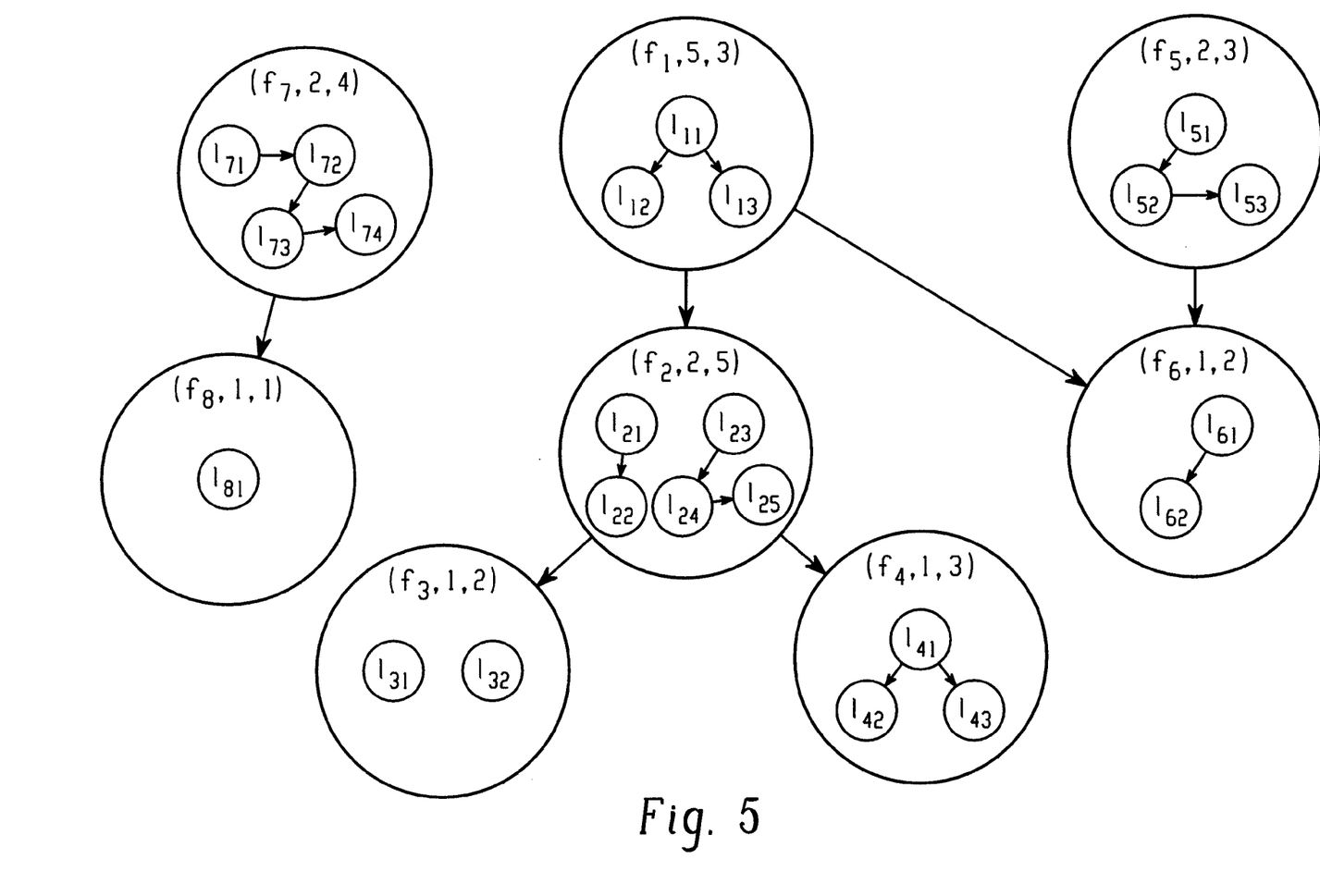
FIG. 5 is an example of a cover forest.

The sites in the cover forest are analyzed at step 15 using as input the passing responses and information identifying the neighbors of the site to reduce the number of faults in each node and therefore the number of nodes, a process called "deforestation." The output of the step 15 is a deforested cover forest that is input to step 16. Step 16 extracts a set of logic conditions for the physical neighbors responsible for the fault manifestation as shown graphically in FIG. 2. Turning to FIG. 2, the table in the upper left-hand corner illustrates all the possible bit combinations for nodes n1, n2, n3, n4 which are the neighbors for a particular site $S_i$. Certain of the bit combinations coincide with failing patterns explained by $S_i$; certain of the bit combinations coincide with passing patterns explained by $S_i$, and the result of certain bit combinations is unknown. From the table, the neighborhood function can be extracted as shown in the bottom left corner. FIG. 2 also illustrates that more information from test generation via ATPG can be used to identify if the unknown entries are feasible, and the neighborhood function extracted from the updated table in the bottom right corner of FIG. 2 is made more precise.

Figure 3:
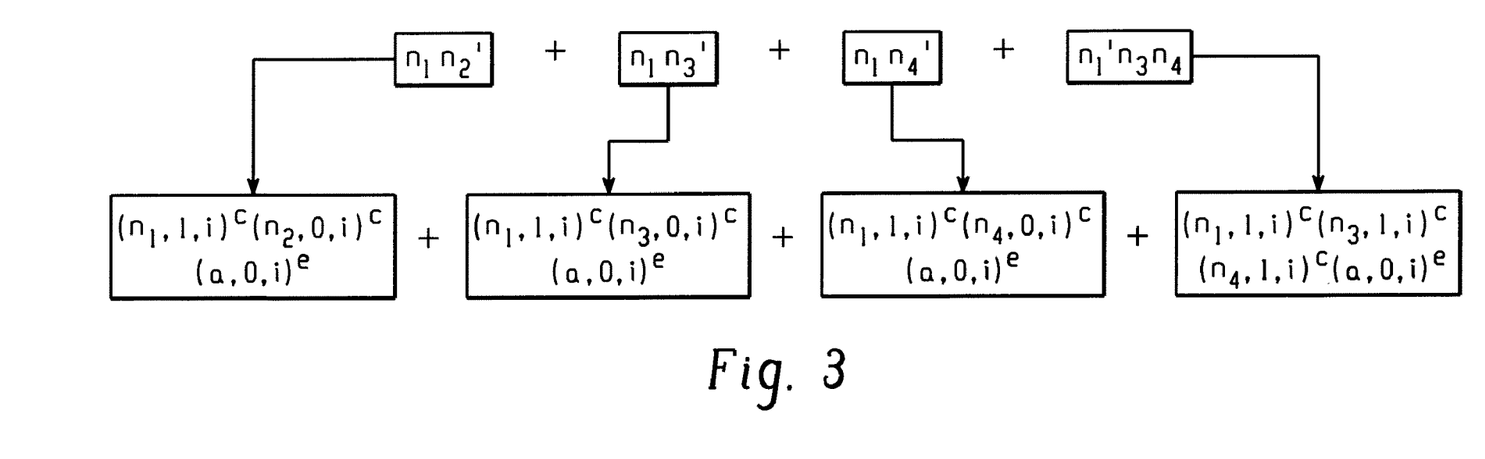
FIG. 3 graphically illustrates the process of mapping a neighborhood function to a fault tuple.

After the logic conditions have been identified, the fault and the excitation conditions (i.e., the neighborhood functions) for each site are disjunctively combined into a macrofault. Before or after the combination into a "macrofault," the neighborhood functions are mapped to fault tuples of the form (line, line value, clock constraint) as shown in FIG. 3. The macrofaults for each fault location are then combined to represent a defect's misbehavior in a fault derivation step 18. Finally, the derived faults are validated via simulation at step 20 using existing and possibly additional test patterns to validate that the macrofault mimics defect behavior. The validated faults are output as candidate faults. When defects do not meet our assumptions, it is possible that incorrect locations and/or neighbor functions are derived early in the diagnosis methodology. To account for error in the early stages, feedback from the validation steps 15, 20 to the location identification step 14 is used to backtrack and relax some of the assumptions. To improve diagnosis resolution, accuracy and confidence, the validated faults may be used to generate additional test patterns at step 22 that, in turn, uses a description of the CUD as input.

Tester Response Analysis—12 and Fault Location Identification—14

We now provide the details of the various steps of our method 10. Initially, at step 12, we partition the set of test patterns into failing and passing patterns by comparing the output response of the CUD, called a tester response, and its fault-free response for every test pattern. We then reduce the search space for faulty signal lines by performing a path-trace procedure from the failing outputs for all the failing patterns. The path-trace procedure is very conservative and is guaranteed to include all possible faulty signal lines (even for the case where multiple lines are faulty simultaneously). The output of path-trace is a list of stuck-at faults, represented by the set $S_p$. The signal lines associated with the faults in $S_p$ are marked as lines that are potentially affected by one or more defects.

Figure 4:
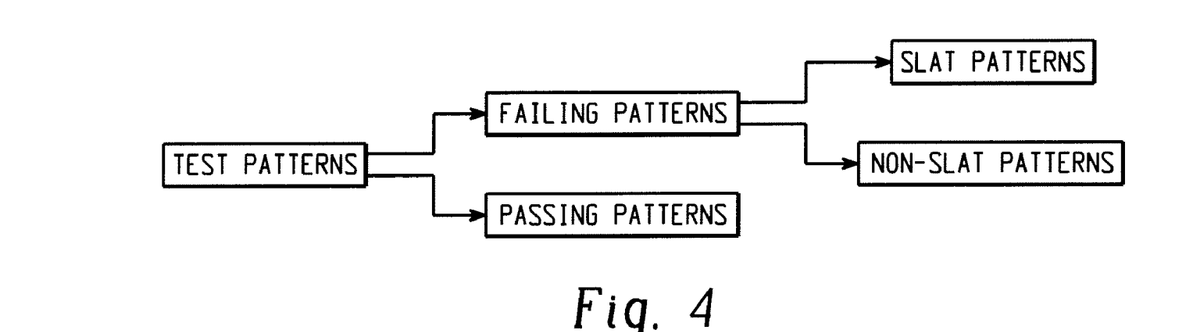
FIG. 4 illustrates a method for classifying test patterns.

After path-trace, failing patterns are categorized as SLAT and non-SLAT patterns as shown in FIG. 4. SLAT patterns are obtained by simulating the stuck-at faults in $S_p$ and finding those failing patterns that can be explained by at least one fault in $S_p$. A fault is said to explain a test pattern if the tester response for the pattern exactly matches the simulation response of the fault. All failing patterns that are not SLAT patterns are called non-SLAT patterns. In this work, we use only SLAT patterns for deriving potential defect sites but all patterns are used during the fault validation step 20. At this stage, we make the following assumption based on our experience in dealing with various defect types as well as empirical data published in the literature.

Assumption 1. For each line $l_i$ affected by an arbitrary defect in a CUD, there exists at least one SLAT pattern explained by a stuck-at fault on $l_i$.

Non-SLAT patterns represent the failing patterns that cannot be explained by any one stuck-at fault and, therefore, must be due to the presence of a defect that simultaneously affects multiple lines. It is possible, however, that multiple faults can cause a failing pattern to appear as a SLAT pattern (and, thus, cause the failing pattern to be explained by a single stuck-at fault) due to error masking. The explaining stuck-at fault represents an incorrect or misleading diagnosis. Our methodology will correctly identify the stuck-at fault as an incorrect diagnosis and remove it from consideration for future algorithmic stages during the validation stage. We do not use non-SLAT patterns for defect site identification at this time; they are used however for the purpose of fault model validation as shown in FIG. 1.

Even though the set of suspect lines returned by path-trace is much smaller than the set of all circuit lines, $S_p$ can be quite large. To further reduce the size of $S_p$, we adopt an approach similar to per-test diagnosis. Per-test diagnosis treats each individual test response as an independent diagnosis. For each SLAT pattern, the CUD exhibits a certain logical misbehavior. Per-test diagnosis attempts to identify the cause of misbehavior for each SLAT pattern. In our approach, we first collapse the faults in $S_p$ using local equivalence and then fault simulate the representative faults of each equivalence class using SLAT patterns to identify the patterns explained by each class. Only the classes that explain at least one SLAT pattern are retained.

The result of per-test diagnosis is a set of stuck-at fault classes along with the SLAT patterns that each fault class explains. The stuck-at faults in these classes represent potential defect locations and are represented using a graphical data structure we call a cover forest. A cover forest is a directed acyclic graph in which each class of equivalent (under the SLAT patterns) stuck-at faults are represented as a vertex of the graph. A directed edge from vertex "a" to a different vertex "b" exists, if and only if, the faults represented by "a" explains all the failing patterns explained by "b" but not vice-versa. That is, if "a" and "b" explain the same set of SLAT patterns, the two faults will belong to the same vertex.

An example of a cover forest is shown in FIG. 5. Each vertex of the cover forest is labeled with a tuple (fi, s, n), where fi is the representative of the equivalence class of faults in the vertex, s is the number of SLAT patterns explained by each fault belonging to the vertex, and n is the number of faults in the vertex. A fault set that explains the most number of SLAT patterns is positioned at the top of the forest and is called a root vertex. This directed acyclic graph is called a forest because the graph can potentially have more than one tree. For example, the graph in FIG. 5 has three trees rooted at $(f_7, 2, 4)$, $(f_1, 5, 3)$ and $(f_5, 2, 3)$. The relation among faults with respect to SLAT patterns can easily be deduced from the cover forest. For example, it can be observed that two of the five SLAT patterns explained by $f_1$ are also explained by $f_2$, and one SLAT pattern explained by $f_1$ is explained by $f_6$. However, because there is no edge from $f_2$ to $f_6$, the SLAT pattern explained by $f_6$ must be different from those explained by $f_2$.

Besides the fact that stuck-at faults are grouped together by their explanation of the same SLAT patterns, the cover forest also contains two additional pieces of information: (1) for every stuck-at fault in the cover forest, the forest contains the exact list of SLAT patterns explained by the stuck-at fault, and (2) as shown in FIG. 5, for every vertex in the cover forest, a sub-circuit graph is stored that represents the structural relationship among the stuck-at fault sites in the vertex. The sub-circuit graph is a directed acyclic graph where each stuck-at fault site is represented as a vertex of the graph. A directed edge exists between two vertices $l_i$ and $l_j$, if $l_j$ is in the transitive fanout of $l_i$. The structural connections between different fault sites can be utilized for generating fault distinguishing test patterns for increasing diagnostic resolution.

Generation of a cover forest involves the accumulation of defect behaviors per failing pattern. For every SLAT pattern, a defect manifests as a stuck-at fault on at least one line $l_i$. This provides significant evidence that a defect has at least an affect on $l_i$. This theory of evidence and belief that a defect partially involves $l_i$ has appeared previously in the literature.

Without any loss of generality, it can be assumed that every stuck-at fault in the cover forest provides an instance of a defect behavior. Heuristically, the stuck-at faults belonging to the root vertices present the strongest evidence of defect manifestation. However, every stuck-at fault must be examined to ensure completeness.

Other per-test diagnosis approaches attempt to rank the stuck-at faults based on their potential to explain failing patterns, and finding minimal covers of faults that explain all failing or all SLAT patterns. The sites associated with the stuck-at faults in the covers are then reported as defect locations. In certain of the past approaches, covers of faults are ranked using Bayesian probabilities rather than using minimal covers and there is an attempt to correlate the top-ranking covers with a set of common fault models. While that approach is a significant step towards characterization, it has two limitations: (1) the approach is dependent upon the accuracy of the fault models and its applicability is limited to the cases when a defect behaves like the set of chosen fault models, and (2) the approach does not validate the behavior of a defect conjectured after the correlation step and, therefore, does not check if the selected cover is completely consistent with observed defect behavior.

To address the shortcomings of past approaches, we adopt a neighborhood function extraction approach as shown by step 16 in FIG. 1 and shown graphically in FIG. 2. Specifically, we attempt to derive the precise logical behavior that causes a signal line $l_i$ to be faulty and therefore cause its inclusion in the cover forest.

Passing Pattern Validation—15

Inadvertently, incorrect faults are included in the cover forest due to stuck-fault equivalencies. In this section, we describe how the stuck-fault equivalencies can be severed in an attempt to remove the incorrect faults. Specifically, we use passing patterns (and additional diagnostic test patterns) to validate the correctness of a fault.

Simulation of faults in a cover forest using passing patterns can be used to reduce the size of the cover forest. It is important to note however that a stuck-at fault cannot be removed simply because the fault is detected by a passing pattern. A fault in the forest only captures the effect of a defect; a defect may, in reality, require one or more excitation conditions that are captured, ultimately, by its neighborhood function.

In passing pattern validation, each test that detects a cover forest fault $l_i/v$ is examined through simulation to determine the bit values for the neighbors. If the neighbors have the same bit values for one failing test pattern that explains $l_i/v$ and one passing pattern that detects $l_i/v$, this represents an inconsistency that cannot happen based on our assumptions. The fault $l_i/v$ therefore cannot be involved in a defect and can be removed from the forest. We use this principle to remove incorrect faults from the cover forest, a process we call deforestation.

Deforestation reduces the size of a cover forest which means the number of faulty behaviors investigated during FA is also reduced. Deforestation can potentially remove all the faults belonging to a vertex, resulting in vertex elimination. The adjusted cover forest is called a pruned cover forest. For example, if deforestation removes the root vertex $(f_1, 5, 3)$ in FIG. 5, the vertex $(f_2, 2, 5)$ becomes a root vertex and the edge between $(f_1, 5, 3)$ and $(f_6, 1, 2)$ is deleted.

Neighborhood Function Extraction—16

Neighborhood function extraction (NFE), step 16, refers to the process of identifying the logic-level conditions associated with defect activation, i.e., a defect's excitation conditions. Potential defect locations, in the form of stuck-at faults, are contained in the cover forest. For each potential defect location to manifest as a stuck-line, certain logic-level conditions on the physical neighbors may be required. Note, that if a defect shorts a line $l_i$ to one of the power rails, then the neighbors other than the power rail will most likely have no affect. NFE attempts to identify the logic-level conditions from the SLAT patterns associated with the stuck-line. In this document, NFE is described for defects whose behavior is self contained in one clock period. This means delay defects as well as sequence dependent and delay dependent defects may be misdiagnosed. The current approach can be easily extended to include sequence- and delay dependent defects by analyzing neighborhood activity over an arbitrary number of clock cycles. For NFE, we make one reasonable assumption regarding defect misbehavior, an assumption that is central to the proposed diagnosis method.

Assumption 2. For a given CUD with an arbitrary defect, whenever the defect causes a logical error (i.e., a logic 0 flips to a logic 1 or vice-versa) on a signal line $l_i$, the physical neighbors are the only lines (if any) that cause $l_i$ to be erroneous.

Given that defects are generally localized, Assumption 2 is both conservative and practical. It must be noted here that a defect can possibly affect several signal lines (e.g., a defect can manifest as a multiple stuck-line fault), but the above assumption states that those lines must be physical neighbors of each other. Even in the case of multiple defects, each individual component defect is assumed to obey the above statement. The two important failure mechanisms in CMOS circuits, shorts and opens, certainly satisfy Assumption 2.

Boolean values on the signal lines driving a faulty line $l_i$ and those driving the physical neighbors of $l_i$ are also important. The combination of logic values on the drivers of $l_i$ and its neighbors may be an important factor that determines when $l_i$ becomes faulty. The biased voting model for bridging faults provides an example where relative driving strengths of a faulty line and its neighbors are important for determining faulty behavior. We also recognize that the side inputs of gates that are driven by $l_i$ may also play a role in defect behavior and can include them in the analysis as well.

Given a stuck-at-v fault affecting line $l_i$ (represented as $l_i/v$, $v \in \{0,1\}$), a set of SLAT patterns $T=\{t_1, t_2 \ldots, t_j\}$ explained by $l_i/v$, and the set of signal lines $N=\{n_1, n_2 \ldots, n_k\}$ that are the physical neighbors of $l_i$, a neighborhood function is defined as a Boolean expression that describes the logic values on the "important" signal lines in N for every SLAT pattern in T. The list of physical neighbors N for each fault location $l_i$ can be obtained by using any existing technique involving, for example, critical area or coupling capacitance analysis. In this document, we use critical area analysis to identify lines that are physically close to a location $l_i$ and the logic netlist for identifying inputs of driver and receiver gates.

We derive a neighborhood function as follows. Initially, logic values on the lines in N are obtained using good-value simulation of each SLAT pattern in T. The set of values on the lines in N for each SLAT pattern in T is called a neighborhood state. A neighborhood function describes any patterns in the neighborhood states that may cause defect activation, specifically, that cause $l_i$ to be stuck-at-v for the SLAT patterns in T. The task of identifying patterns among the neighborhood states is equivalent to finding a minimum function that covers all the states. Specifically, the neighborhood states can be viewed as minterms of a truth table (see FIG. 2). States associated with passing patterns in T are treated as maxterms. Boolean minimization techniques are then applied to the truth table to derive a minimum sum-of-products (SOP) expression. The final Boolean expression is the neighborhood function for the fault $l_i/v$. NFE described above makes the following implicit assumption.

Assumption 3. For every SLAT pattern $t_i$ explained by a fault $l_i/v$, the logic value on every neighbor $n_i$ of the location $l_i$ is either fault-free or if it is faulty, only the fault $l_i/v$ could have caused it (i.e., $n_i$ is on an error propagation path of $l_i/v$).

Assumption 3 ensures that we can safely use good-simulation values on the physical neighbors to derive the neighborhood functions. If a defect violates Assumption 3, that is, one or more neighbors have an erroneous value, the neighborhood function derived by NFE may be incorrect.

To illustrate NFE, let us assume there are five physical neighbors ($n_1$, $n_2$, $n_3$, $n_4$, and $n_5$) for some arbitrary defect location $l_i$. Let us further assume that $l_i/1$ explains five SLAT patterns ($p_1$ through $p_5$). Let the logic values on the neighbors for the five SLAT patterns be as shown in Table 1 and assume all remaining bit combinations are associated with passing patterns.

| SLAT patterns | physical neighbors | | | | |
|---|---|---|---|---|---|
| | $n_1$ | $n_2$ | $n_3$ | $n_4$ | $n_5$ |
| $p_1$ | 0 | 0 | 1 | 1 | 1 |
| $p_2$ | 1 | 0 | 0 | 1 | 1 |
| $p_3$ | 0 | 0 | 1 | 1 | 0 |
| $p_4$ | 0 | 0 | 1 | 1 | 0 |
| $p_5$ | 0 | 0 | 0 | 1 | 1 |

As mentioned earlier, each row in Table 1 corresponds to a neighborhood state. Four unique states (the state 00110 is repeated for $p_3$ and $p_4$) are established by these five SLAT patterns. Boolean minimization leads to the function $Z=n'_1 n'_2 n_3 n_4 + n'_2 n'_3 n_4 n_5$ for this truth table.

A quick analysis of the neighborhood function derived above leads to two immediate conclusions:

(1) $n_4$ is always a logic 1, and (2) at least two of the five lines are always at logic 1. Thus, it can be hypothesized that a defect is probably a two-line short between $l_i$ and $n_4$, or maybe the defect is an interconnect open affecting $l_i$, where the neighbors $n_3$, $n_4$ and $n_5$ are imposing a logic-1 on the floating line $l_i$. However, no hypothesis is correct unless validated. Therefore, our methodology includes a validation step 18 after the NFE step 16 as described below.

Neighborhood Pruning

The list of physical neighbors for a defect location required for NFE can be reduced using three main strategies. First, for a given fault on an arbitrary defect location $l_i$, any neighbor $n_i$ whose logic value is implied by fault detection, can be removed because the participation of $n_i$ towards the neighborhood function is already known. For example, for the circuit state shown in FIG. 6, $l_3/1$ explains a SLAT pattern, both $l_1$ and $l_2$ must be logic-1. Therefore, the list of neighbors for $l_3$ can be reduced to $\{l_4, l_5, l_6, l_7\}$.

Figure 6:
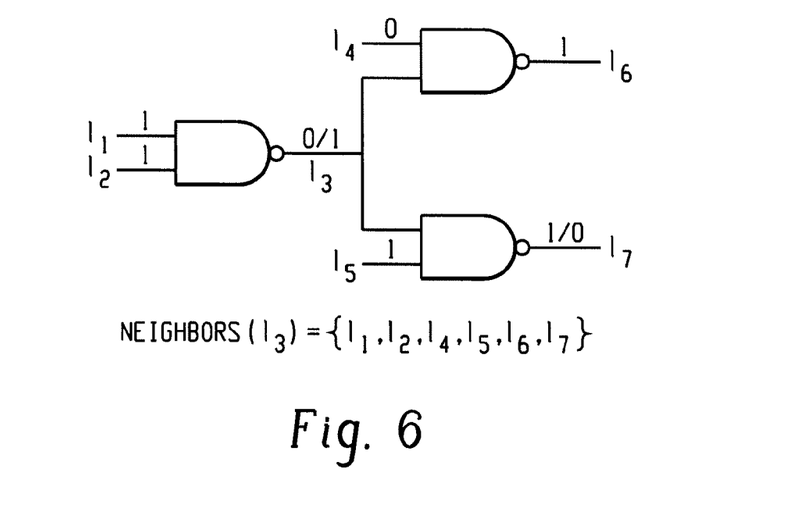
FIG. 6 is an example illustrating neighborhood pruning; $l_3$ stuck-at-1 explains the SLAT pattern shown in the figure, which means that certain neighbors are implied and can therefore possibly be ignored during further analysis.

Second, given a stuck-at fault on $l_i$, any neighbor $n_i$ on a sensitized path can be eliminated on a per-test basis because the logic value on $n_i$ cannot cause a defect to manifest as a stuck-at fault on $l_i$ in the same clock period. In FIG. 6, because $l_7$ lies on the propagation path of $l_3/1$ for the test pattern shown, the logic value on $l_7$ is directly controlled by the faulty value on $l_3$. Therefore, $l_7$ cannot be among the neighbors that control the activation of $l_3/1$ within that clock period.

Third, for a fault $l_i/v$ that explains a SLAT pattern $t_i$, any neighbor that is not driven to v most likely cannot be involved in causing a stuck-at-v fault on $l_i$ and, thus, potentially can be dropped for $t_i$.

These three strategies for reducing the size of the neighborhood can be employed to increase the precision of the extracted function. For example, applying strategy three to the function $Z=n'_1n'_2n_3n_4+n'_2n'_3n_4n_5$ for $l_i/l$, leads to the reduced function $Z=n_3n_4+n_4n_5$.

Fault Derivation—18 and Fault Validation—20

The output of the neighbor function extraction step 16 is one or more faults, where each fault is now associated with a neighborhood function that describes a portion of the total defect behavior. As shown in FIG. 1, the next step involves combining these individual behavior portions into final model(s) of the defect behavior (fault derivation 18) which model(s) can then be saved. The model(s) are subsequently validated using, for example, all SLAT, non-SLAT and passing test patterns in fault validation step 20.

For fault model construction and validation, we utilize fault tuples of the form (line, line value, clock constraint). The choice of fault tuples is attributed to two primary reasons: (1) fault behaviors extracted from step 16 are arbitrary, which may or may not be modeled using traditional fault models. Fault tuple macrofaults provide a means to capture and simulate the arbitrary logic-level behaviors from step 16. (2) Fault tuples-based ATPG enables generation of additional ATPG for improving the confidence, accuracy and resolution where confidence is a measure of how well the test set exposes failure, accuracy is a measure of how well a macrofault explains a failure, and resolution is the number of macrofaults identified by diagnosis.

The best way to describe macrofault formation is through an example. Consider a fault cover consisting of the two faults, $l_1/0$ and $l_2/1$. The neighborhood functions and the corresponding fault tuples representation for these two faults are summarized in Table 2. Specifically, the representation corresponding to the first fault captures only the faulty-0 on $l_1$ because the neighborhood function indicates that no additional conditions are required to make $l_1$ faulty. For $l_2/1$ on the other hand, there are two sets of conditions that make $l_2$ faulty-1. These two sets are separated by a '+' in the fault tuples representation.

| Fault | Nbr. function | Fault tuples representation |
|---|---|---|
| $l_1/0$ | 1 | $(l_1, 0, i)^e$ |
| $l_2/1$ | $n_1n_3 + n_1n_3n_4$ | $(l_2, 1, i)^e(n_1, 1, i)^c(n_3, 0, i)^c +$ $(l_2, 1, i)^e(n_1, 0, i)^c(n_3, 1, i)^c(n_4, 1, i)^c$ |

The final macrofault is a disjunction of the fault tuples representations of the two TSL faults and has the form: $\{(l_1, 0, i)^e + (l_2, 1, i)^e(n_1, 1, i)^c(n_3, 0, i)^c + (l_2, 1, i)^e(n_1, 0, i)^c(n_3, 1, i)^c(n_4, 1, i)^c\}$. This macrofault captures the faulty values on both $l_1$ and $l_2$ along with the conditions that cause these faulty values, respectively. Given that a macrofault is extracted directly from the analysis of SLAT patterns, it accurately captures the defect behavior for the set of SLAT patterns. However, a model is not 100% accurate unless it explains all the test patterns in the applied test set, including the passing and non-SLAT patterns.

The macrofault simulation step enables quantification of accuracy for each extracted macrofault. Specifically, each macrofault is simulated using a fault tuples-based fault simulator against all the test patterns. The resulting macrofault response is compared with the CUD tester response to identify the number of test patterns explained by the macrofault. Based on a user-defined threshold value for accuracy, a subset or all of the extracted macrofaults are reported as diagnosis candidates. For example, 100% accuracy is used as the threshold in this paper, that is, only those macrofaults that explain all test patterns are reported as candidates.

Additional ATPG—22

Deforestation using passing patterns (see discussion of step 15 above) may not always result in a substantial reduction in the size of the cover forest. For a passing pattern to be effective in removing an incorrect fault, the pattern must detect that fault in simulation.

To alleviate this shortcoming, our methodology allows application of additional test patterns. The primary objective of additional ATPG is to distinguish macrofaults that pass the passing pattern validation. Ways of distinguishing macrofaults are known in the art. Another objective for additional test patterns is to maximize the number of unique neighborhood states reached by test patterns for each fault in the cover forest or to increase the size of the neighborhood.

While not a common industry practice, the generation of new test responses for increasing diagnosis accuracy has been proposed.

Section 3

Implementations

Figure 7:
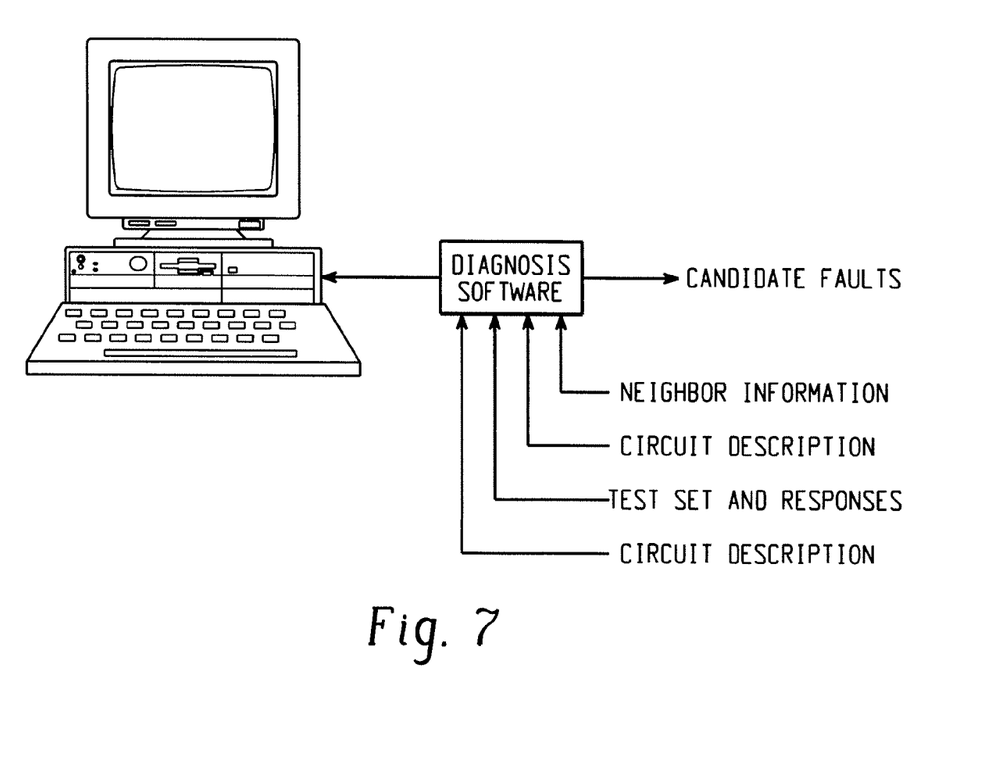
FIG. 7 illustrates a platform upon which the method of the present disclosure may be practiced.

Referring now to FIG. 7, as will be appreciated by one of skill in the art, the present invention may be embodied as a method, a data processing system, or a computer program product. Accordingly, the present invention may take the form of an entirely hardware embodiment, an entirely software embodiment, or an embodiment combining software and hardware aspects. Furthermore, the present invention may take the form of a computer program product on a computer-usable storage medium having computer-usable program code embodied in the medium. Any suitable computer readable medium may be utilized including hard disks, CD-ROMs, optical storage devices, or magnetic storage devices.

The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

The present invention is described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flow chart and/or block diagram block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the flowchart and/or block diagram block or blocks.

Section 4

Experiments and Results

High diagnostic resolution is one of the major requirements of fault diagnosis. To reduce the effort spent in FA, it is imperative that only correct fault locations are included in a diagnosis outcome. Deforestation enables elimination of incorrect fault locations, identified using inconsistent passing and failing patterns, by severing stuck-fault equivalencies.

In this section, we present results for the passing pattern validation stage of our methodology. For a variety of localized defects that include various types of shorts and opens, we present results that demonstrate the utility of neighborhood function extraction and passing pattern validation in reducing the number of faults (and subsequently the locations) that need to be investigated for FA. Specifically, in the results presented here, we compare the number of stuck-at faults in the root vertices of a cover forest versus those in the root vertices of a pruned cover forest following deforestation. We focus on roots in the cover forest since they represent the strongest evidence of defect behavior. For the defects diagnosed in this experiment, over 98% of a defect's locations belong to the roots of the pruned cover forest. Note, the roots in a cover forest may be removed by deforestation, resulting in new roots in a pruned cover forest.

We use five ISCAS benchmark circuits for this experiment. The circuits are first logically optimized using Synopsys Design Compiler. The optimized designs are synthesized using a commercial physical synthesis tool using a 0.18 μm standard cell library. The generated layout is then analyzed by a commercial critical area analysis tool to generate physical neighborhoods for a neighborhood radius up to 0.5 μm. For logic diagnosis purposes, a gate-level netlist consisting of primitive gates is extracted from the standard cell design. For each circuit, we use a 100% stuck-at test set.

For each circuit, we simulated various types of two- and three-line shorts to generate test responses. The shorted lines are selected based on critical area analysis. We created short models where one line dominates the other based on the relative driving strengths of the two lines. Driving strengths of lines were determined based on the number of ON and OFF transistors. We also included the commonly used AND/OR and dominating bridge models. We modeled three-line shorts using a majority function, that is, a line is faulty-v if the other two lines are driven to v. Further, we created models of opens based on analyses known in the art.

Figure 8:
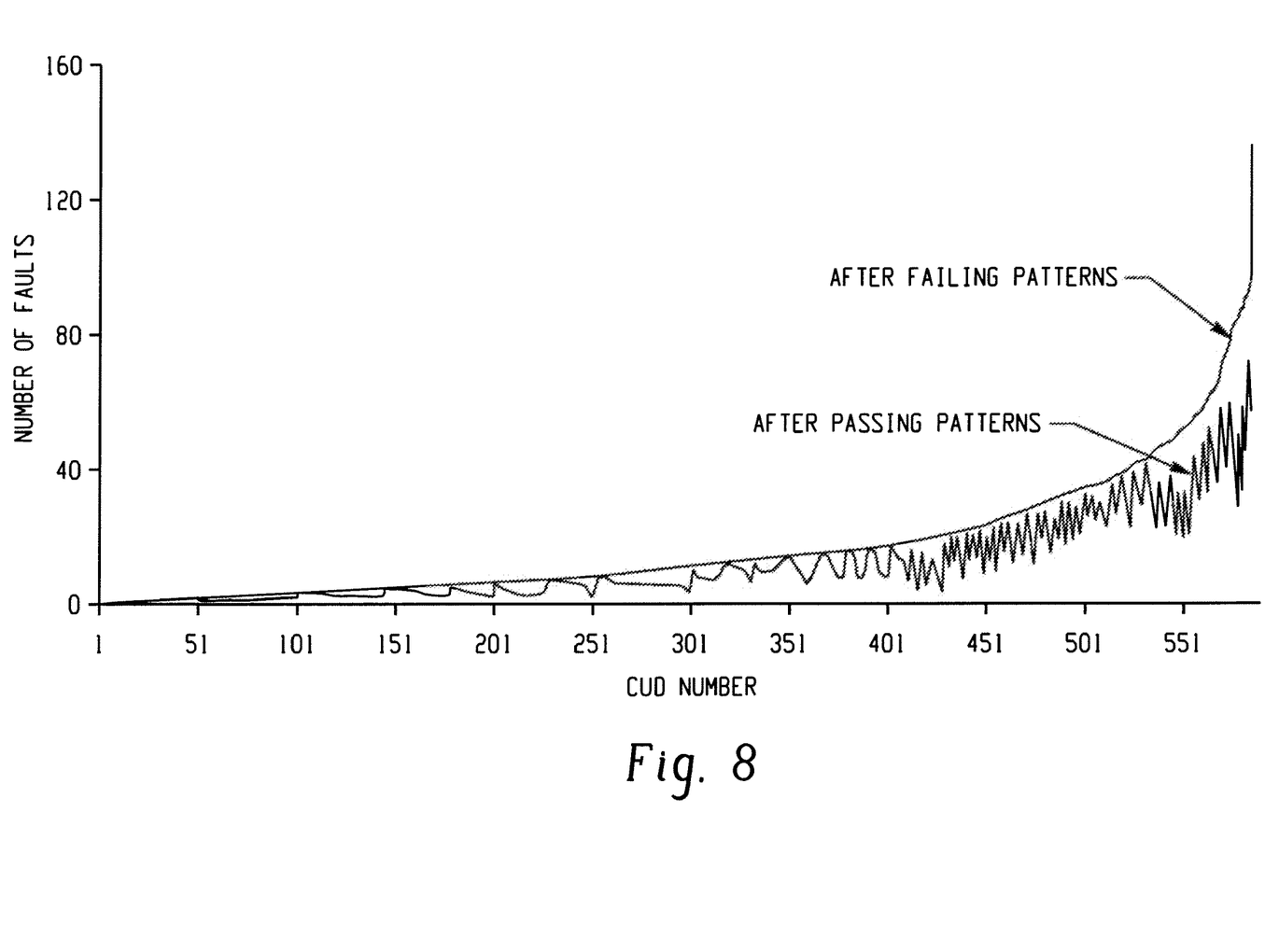
FIG. 8 is a graph illustrating the reduction in the number of fault candidates.

FIG. 8 illustrates the reduction in the number of fault candidates when passing patterns are utilized. FIG. 8 contains all the results for 357 two-line shorts, 123 three-line shorts, and 107 opens simulated for the five benchmarks. All the results are combined to show the overall effectiveness of deforestation. FIG. 8 is a histogram comparing the number of faults in the cover forest before and after passing pattern validation. The CUDs on the X-axis are ordered from left to right based on the number of faults in their root vertices before deforestation. We make the following observations from FIG. 8.

For 587 diagnosed CUDs, there is a reduction in the number of faults for 442 CUDs after passing patterns are utilized. For the remaining 145 CUDs, passing pattern validation is not able to remove any fault from the cover forest. For these 145 CUDs, either the roots in the initial cover forest do not contain any incorrect faults, or the available passing patterns do not possess any distinguishing capability. For such cases, additional ATPG is required to increase diagnostic resolution. Overall, for all the 587 CUDs considered, there is an average reduction of 22.8% in the number of faults, while the maximum reduction is 85% for one CUD. An important point to note here is that the actual defect locations are never dropped in any of the 587 diagnosed CUDs.

The results of deforestation indicate two important points: (1) the number of faults that need to be investigated is reduced, and each fault is now associated with precise excitation conditions, and (2) the macrofaults remaining after the passing pattern validation denote stronger candidates representing defect behavior as they have been validated with passing patterns in addition to the failing patterns.

More test results can be found in Desineni et al., "A logical Diagnosis Methodology for Improved Localization and Extraction of Accurate Defect Behavior," International Test Conference, October 2006, which is hereby incorporated by reference in its entirety.

Section 6

Conclusions

A generalized methodology for diagnosis of arbitrary defects in logic circuits is presented. The proposed methodology addresses both defect localization and characterization. Logic-level defect characterization can lead to better localization and a better understanding of a defect's nature in general. Characterization can lead to a significant reduction or altogether elimination of the effort involved in physical failure analysis. Unlike past diagnosis approaches for identifying defect types, our methodology does not use assumptions regarding defect behavior in the form of fault models; the methodology derives defect behavior from the test data.

In a preferred embodiment, the disclosed methodology uses a fault model-independent per-test diagnosis approach to first identify potential defect locations. These locations are then supplemented with physical-neighbor based neighborhood functions to describe the conditions for defect manifestation. An important aspect of the disclosed diagnosis methodology is the observation that physical neighbors of a potential defect location may be an important factor in deriving a defect's behavior. Hypotheses concerning a defect under diagnosis are subsequently modeled using fault tuples to enable fault simulation and diagnostic test pattern generation. Test pattern and tester response analysis lead to pruning of incorrect defect locations as well as identification of accurate neighborhood functions. Results indicate that passing pattern validation allows stuck-fault equivalencies to be severed leading to a reduction in the number of sites that need to be examined for FA.

While the present invention has been described in conjunction with preferred embodiments, those of ordinary skill in the art will recognize that many modifications and variations are possible. Such modifications and variations are intended to be covered by the following claims. The section headings appearing in this document are for purposes of organization and convenience and should not be relied upon in construing the claims.

What is claimed is:

1. A method of constructing a model of failures from diagnosing faults in integrated circuits, comprising:
   a microprocessor for executing diagnostic software steps comprising:
   examining a first plurality of failed test responses to identify a second plurality of fault locations;
   for at least certain of said second plurality of fault locations, constructing a model of a fault based on a Boolean expression describing logic values appearing on signal lines in a list of physical neighbors for each single location at a time (SLAT) pattern in a set of SLAT patterns; and
   storing said model.

2. The method of claim 1 wherein said constructing a model comprises combining logic values for each fault location into a macrofault for that location.

3. The method of claim 1 additionally comprising eliminating logic values of certain locations neighboring said fault location.

4. The method of claim 3 wherein said eliminating is based on one of the following conditions:
   where a logic value can be implied by fault detection; or
   where the logic value can be shown not to contribute to said failed test response.

5. A method of constructing a model of failures from diagnosing faults in integrated circuits, comprising:
   a microprocessor for executing diagnostic software steps comprising:
   examining a first plurality of failed test responses to identify a second plurality of fault locations;
   for at least certain of said second plurality of fault locations, constructing a model of a fault based on conditions of locations neighboring a fault location and needed to explain a failed test response; and
   storing said model, and
   wherein said second plurality of fault locations are identified in a graph of tuples of the form (fi, s, n) where fi is the representative of the equivalence of faults in a vertex of the graph, s is the number of patterns explained by each fault belonging to the vertex, and n is the number of faults in the vertex.

6. The method of claim 5 additionally comprising eliminating vertices from said graph.

7. A method of constructing a model of failures from diagnosing faults in integrated circuits, comprising:
   a microprocessor for executing diagnostic software steps comprising:
   examining a first plurality of failed test responses to identify a second plurality of fault locations;
   for at least certain of said second plurality of fault locations, constructing a model based on a Boolean expression describing logic values appearing on signal lines in a list of physical neighbors for each single location at a time (SLAT) pattern in a set of SLAT patterns and assuming (i) there exists at least one SLAT pattern explained by a stuck-at fault, and (ii) physical neighbors of a fault location are the only locations that can cause the stuck-at fault; and
   storing said model.

8. The method of claim 7 wherein said constructing a model comprises combining said logic values for each fault location into a macrofault for that location.

9. The method of claim 7 additionally comprising eliminating logic values of certain locations neighboring said fault location.

10. The method of claim 9 wherein said eliminating is based one of the following conditions:
    where a logic value can be implied by fault detection; or
    where the logic value can be shown not to contribute to said failed test response.

11. A method of constructing a model of failures from diagnosing faults in integrated circuits, comprising:
    a microprocessor for executing diagnostic software steps comprising:
    examining a first plurality of failed test responses to identify a second plurality of fault locations;
    for at least certain of said second plurality of fault locations, constructing a model assuming (i) there exists at least one single location at a time pattern explained by a stuck-at fault, and (ii) physical neighbors of a fault location are the only locations that can cause the stuck-at fault; and
    storing said model, and
    wherein said constructing a model additionally comprises assuming (iii) for every pattern explained by a fault stuck-at-v, the logic value on every neighbor of the location is either fault-free or if it is faulty, only the fault stuck-at-v could have caused it.

12. The method of claim 11 wherein said second plurality of fault locations are identified in a graph of tuples of the form (fi, s, n) where fi is the representative of the equivalence of faults in a vertex of the graph, s is the number of patterns explained by each fault belonging to the vertex, and n is the number of faults in the vertex.

13. The method of claim 12 additionally comprising eliminating vertices from said graph to produce said certain of said second plurality of fault locations.

14. A method of diagnosing faults in integrated circuits, comprising:
    a microprocessor for executing diagnostic software steps comprising:
    performing a plurality of tests on an integrated circuit to produce passing and failing responses;
    examining said failing responses in conjunction with circuit description data to identify fault locations;
    reducing the number of said identified fault locations;
    for each of said reduced number of fault locations, constructing a model based on a Boolean expression describing logic values appearing on signal lines in a list of physical neighbors for each single location at a time (SLAT) pattern in a set of SLAT patterns
    combining said logic values for each fault location into a macrofault for that location;
    validating said macrofaults; and
    outputting validated macrofaults.

15. The method of claim 14 wherein said macrofaults are expressed as fault tuples of the form including an identification of a signal line, a signal line value, and a clock cycle constraint.

16. The method of claim 15 additionally comprising eliminating logic values of certain locations neighboring said fault location from said macrofaults.

17. The method of claim 16 wherein said eliminating is based one of the following conditions:
   where a logic value can be implied by fault detection; or
   where the logic value can be shown not to contribute to said failed test response.

18. The method of claim 14 additionally comprising generating test patterns based on validated macrofaults, and using said generated test patterns to improve one of the accuracy and resolution of the validated macrofaults.

19. A method of diagnosing faults in integrated circuits, comprising:
   a microprocessor for executing diagnostic software steps comprising:
   performing a plurality of tests on an integrated circuit to produce passing and failing responses;
   examining said failing responses in conjunction with circuit description data to identify fault locations;
   reducing the number of said identified fault locations;
   for each of said reduced number of fault locations, identifying logic level conditions at neighboring locations which describe the behavior of a failing response;
   combining said logic level conditions for each fault location into a macrofault for that location;
   validating said macrofaults; and
   outputting validated macrofaults, and
   wherein said fault locations are identified in a graph of tuples of the form (fi, s, n) where fi is the representative of the equivalence of faults in a vertex of the graph, s is the number of patterns explained by each fault belonging to the vertex, and n is the number of faults in the vertex.

20. The method of claim 19 wherein said reducing comprises eliminating vertices from said graph.

21. A non-transitory computer readable medium carrying a set of instructions which, when executed by a microprocessor, perform a method comprising:
   examining a first plurality of failed test responses to identify a second plurality of fault locations;
   for at least certain of said second plurality of fault locations, constructing a model of a fault based on a Boolean expression describing logic values appearing on signal lines in a list of physical neighbors for each single location at a time (SLAT) pattern in a set of SLAT patterns; and
   storing said model.

22. A non-transitory computer readable medium carrying a set of instructions which, when executed by a microprocessor, perform a method comprising:
   examining a first plurality of failed test responses to identify a second plurality of fault locations;
   for at least certain of said second plurality of fault locations, constructing a model based on a Boolean expression describing logic values appearing on signal lines in a list of physical neighbors for each single location at a time (SLAT) pattern in a set of SLAT patterns and assuming (i) there exists at least one single location at a time pattern explained by a stuck-at fault, and (ii) physical neighbors of a fault location are the only locations that can cause the stuck-at fault; and
   storing said model.

23. A non-transitory computer readable medium carrying a set of instructions which, when executed by a microprocessor, perform a method comprising:
   performing a plurality of tests on an integrated circuit to produce passing and failing responses;
   examining said failing responses in conjunction with circuit description data to identify fault locations;
   reducing the number of said identified fault locations;
   for each of said reduced number of fault locations, constructing a model based on a Boolean expression describing logic values appearing on signal lines in a list of physical neighbors for each single location at a time (SLAT) pattern in a set of SLAT patterns;
   combining said logic values for each fault location into a macrofault for that location;
   validating said macrofaults; and
   outputting validated macrofaults.

* * * * *

UNITED STATES PATENT AND TRADEMARK OFFICE
CERTIFICATE OF CORRECTION

PATENT NO. : 7,770,080 B2  Page 1 of 1
APPLICATION NO. : 11/651782
DATED : August 3, 2010
INVENTOR(S) : Blanton et al.

It is certified that error appears in the above-identified patent and that said Letters Patent is hereby corrected as shown below:

Column 5, Line 46, after "faults in the vertex," insert -- s --.

Column 14, Line 28, delete "logical" and substitute therefore -- Logical --.

Column 16, Line 8, after "based" insert -- on --.

Column 17, Line 2, after "based" insert -- on --.

Signed and Sealed this

Fifth Day of October, 2010

David J. Kappos
*Director of the United States Patent and Trademark Office*